(12) United States Patent
Fan et al.

(10) Patent No.: US 10,937,891 B2
(45) Date of Patent: Mar. 2, 2021

(54) SPACER STRUCTURE AND MANUFACTURING METHOD THEREOF

(71) Applicant: Taiwan Semiconductor Manufacturing Company Ltd., Hsinchu (TW)

(72) Inventors: Fu-Jier Fan, Hsinchu (TW); Kong-Beng Thei, Hsin-Chu Country (TW); Szu-Hsien Liu, Hsinchu County (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 0 days.

(21) Appl. No.: 16/048,601

(22) Filed: Jul. 30, 2018

(65) Prior Publication Data

US 2018/0337249 A1  Nov. 22, 2018

Related U.S. Application Data

(62) Division of application No. 15/200,503, filed on Jul. 1, 2016.

(Continued)

(51) Int. Cl.
*H01L 29/66* (2006.01)
*H01L 21/02* (2006.01)
(Continued)

(52) U.S. Cl.
CPC .... *H01L 29/6656* (2013.01); *H01L 21/02271* (2013.01); *H01L 21/28525* (2013.01);
(Continued)

(58) Field of Classification Search
CPC .......... H01L 29/6653–6656; H01L 21/823864
See application file for complete search history.

(56) References Cited

U.S. PATENT DOCUMENTS

| | | | |
|---|---|---|---|
| 6,165,880 A | 12/2000 | Yaung et al. | |
| 6,294,480 B1 * | 9/2001 | Pradeep | H01L 21/31144 |
| | | | 257/E21.252 |

(Continued)

FOREIGN PATENT DOCUMENTS

| | | |
|---|---|---|
| JP | 2001093984 A | 4/2001 |
| TW | 200509392 | 3/2005 |

*Primary Examiner* — Stephen M Bradley
(74) *Attorney, Agent, or Firm* — Haynes and Boone, LLP

(57) ABSTRACT

A spacer structure and a fabrication method thereof are provided. First and second conductive structures are formed over a substrate. A first patterned dielectric layer is formed to cover the first conductive structure and exposing the second conductive structure. A second dielectric layer is formed to cover the first patterned dielectric layer and an upper surface and sidewalls of the second conductive structure. The second dielectric layer disposed over an upper surface of the first conductive structure and the upper surface of the second conductive structure is removed. The first patterned dielectric layer and the second dielectric layer disposed on sidewalls of the first conductive structure form a first spacer structure, and the second dielectric layer disposed on the sidewalls of the second conductive structure forms a second spacer structure. A width of the first spacer structure is larger than a width of the second spacer structure.

20 Claims, 19 Drawing Sheets

Related U.S. Application Data

(60) Provisional application No. 62/273,471, filed on Dec. 31, 2015.

(51) Int. Cl.
    *H01L 21/285*   (2006.01)
    *H01L 21/311*   (2006.01)
    *H01L 21/8234*  (2006.01)
    *H01L 21/8238*  (2006.01)
    *H01L 29/78*    (2006.01)
    *H01L 29/49*    (2006.01)

(52) U.S. Cl.
    CPC ... *H01L 21/31111* (2013.01); *H01L 21/31144* (2013.01); *H01L 21/823437* (2013.01); *H01L 21/823468* (2013.01); *H01L 29/6653* (2013.01); *H01L 21/823864* (2013.01); *H01L 29/4916* (2013.01); *H01L 29/78* (2013.01)

(56) References Cited

U.S. PATENT DOCUMENTS

| | | | |
|---|---|---|---|
| 6,506,642 B1 * | 1/2003 | Luning | H01L 21/823814 257/E21.634 |
| 6,664,156 B1 * | 12/2003 | Ang | H01L 29/4983 257/E29.152 |
| 6,737,308 B2 | 5/2004 | Kim | |
| 7,064,071 B2 * | 6/2006 | Schwan | H01L 21/823864 257/E21.64 |
| 7,291,534 B2 | 11/2007 | Tomita et al. | |
| 7,541,239 B2 | 6/2009 | Curello et al. | |
| 7,569,888 B2 | 8/2009 | Sudo et al. | |
| 7,754,572 B2 * | 7/2010 | Maekawa | H01L 21/823456 438/301 |
| 8,193,586 B2 | 6/2012 | Chen et al. | |
| 8,236,678 B2 | 8/2012 | Yelehanka et al. | |
| 8,309,414 B2 * | 11/2012 | Kawasaki | H01L 21/823468 438/241 |
| 8,450,834 B2 | 5/2013 | Ng et al. | |
| 8,470,662 B2 | 6/2013 | Luo et al. | |
| 9,013,003 B2 | 4/2015 | Liang et al. | |
| 9,209,302 B2 | 12/2015 | Tsai et al. | |
| 9,224,655 B2 | 12/2015 | Jovorka et al. | |
| 2002/0177284 A1 | 11/2002 | Huang et al. | |
| 2005/0045949 A1 | 3/2005 | Lin et al. | |
| 2005/0106844 A1 | 5/2005 | Tung et al. | |
| 2006/0211200 A1 * | 9/2006 | Tomita | H01L 21/823456 438/257 |
| 2008/0099801 A1 * | 5/2008 | Lee | H01L 21/82385 257/288 |
| 2008/0099859 A1 * | 5/2008 | Watanabe | H01L 21/0234 257/408 |
| 2009/0146181 A1 | 6/2009 | Lai et al. | |
| 2009/0294866 A1 * | 12/2009 | Eller | H01L 21/823864 257/369 |
| 2011/0136307 A1 | 6/2011 | Ohta et al. | |
| 2015/0228546 A1 | 8/2015 | Huang et al. | |

* cited by examiner

SPACER STRUCTURE AND MANUFACTURING METHOD THEREOF

CROSS-REFERENCE

This application is a divisional application of U.S. patent application Ser. No. 15/200,503, filed Jul. 1, 2016, which claims priority from Provisional Application 62/273,471, filed Dec. 31, 2015, both are hereby incorporated by reference in their entirety.

BACKGROUND

Spacer is a dielectric structure formed alongside a gate electrode of a metal-oxide-semiconductor field effect transistor (MOSFET) device. In addition to protecting the gate electrode, the spacer is also configured to allow the formation of source/drain regions and/or lightly doped drain (LDD).

In MOSFET devices, leakage currents need to be reduced in order to save power consumption. A leakage source in MOSFET devices is gate-induced drain leakage (GIDL), which is caused by trap assisted band-to-band tunneling at the surface of a drain region that overlaps the gate electrode. GIDL is sensitive to many factors such as the thickness of gate dielectric, the dopant concentration of drain region, the applied gate voltage, and the width of spacer. Apart from GIDL, hot carrier is also sensitive to spacer width. As the complexity and application of integrated circuits increase, more challenges to suppress leakage current and hot carrier among different MOSFET devices arise.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
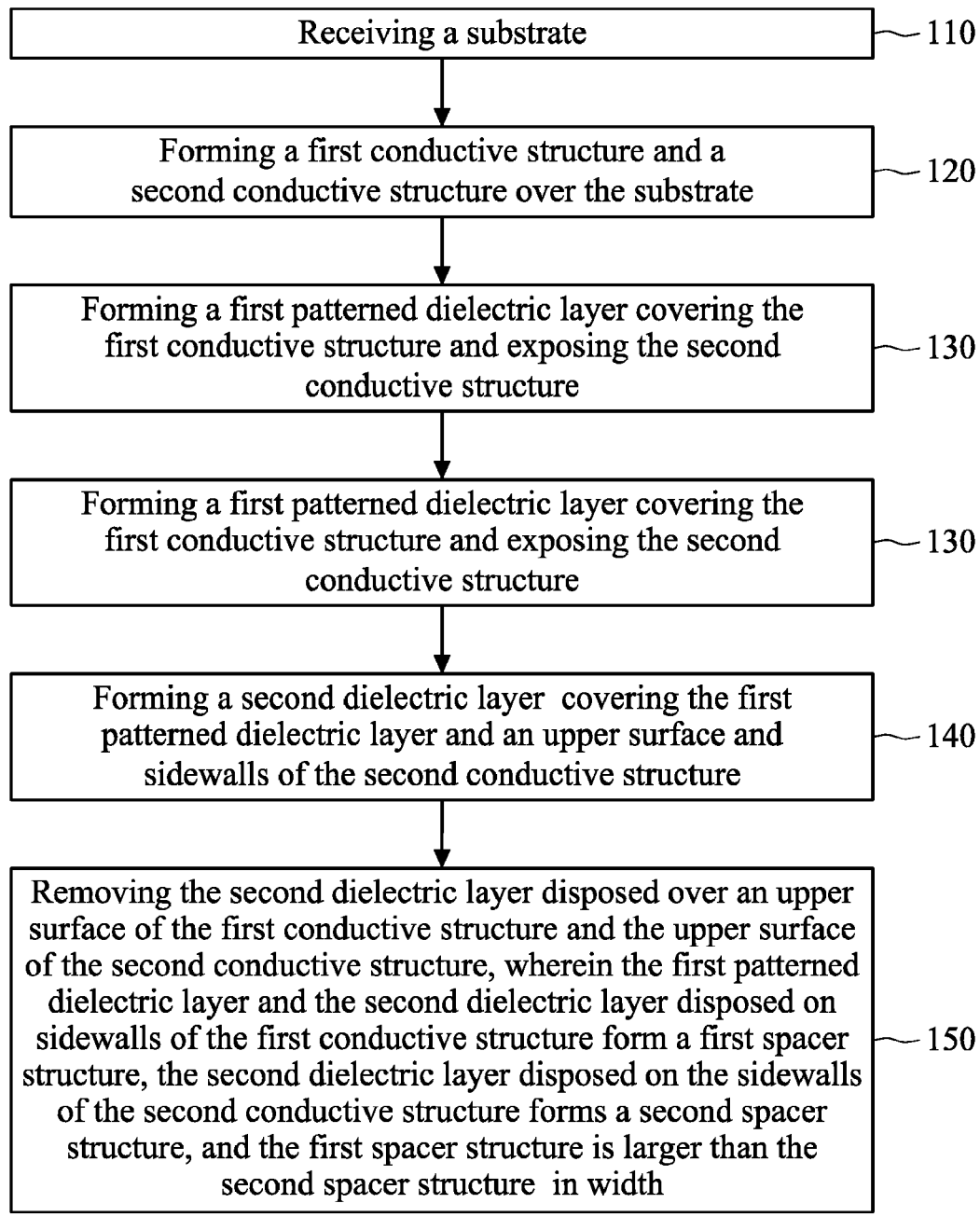
FIG. 1 is a flow diagram illustrating a method for manufacturing spacer structures according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

In the present disclosure, spacer structures with different spacer widths are fabricated by stacking different numbers of dielectric layers. One of the spacer structures is formed from more dielectric layers in a lateral direction, while another one of the spacer structures is formed from less dielectric layer. In some embodiments, one of the spacer structures is formed by stacking two dielectric layers in a lateral direction, while another one of the spacer structures is formed from one dielectric layer. The spacer structure of the present disclosure is self-aligned, less complex and compatible with standard integrated circuit fabrication. The spacer structures having different widths are configured as side spacers of devices to meet diverse requirements or specifications in different applications.

FIG. 1 is a flow diagram illustrating a method for manufacturing spacer structures according to some embodiments of the present disclosure. The method 100 begins with operation 110, in which a substrate is received. The method 100 then continues with operation 120, in which a first conductive structure and a second conductive structure are formed over the substrate. Next, the method 100 continues with operation 130, in which a first patterned dielectric layer covering the first conductive structure and exposing the second conductive structure is formed. The method 100 proceeds with operation 140, in which a second dielectric layer covering the first patterned dielectric layer and an upper surface and sidewalls of the second conductive structure is formed. Subsequently, the method 100 continues with operation 150, in which the second dielectric layer disposed over an upper surface of the first conductive structure and the upper surface of the second conductive structure is removed. The first patterned dielectric layer and the second dielectric layer disposed on sidewalls of the first conductive structure form a first spacer structure. In addition, the second dielectric layer disposed on the sidewalls of the second conductive structure forms a second spacer structure. Moreover, the first spacer structure is larger than the second spacer structure in width.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
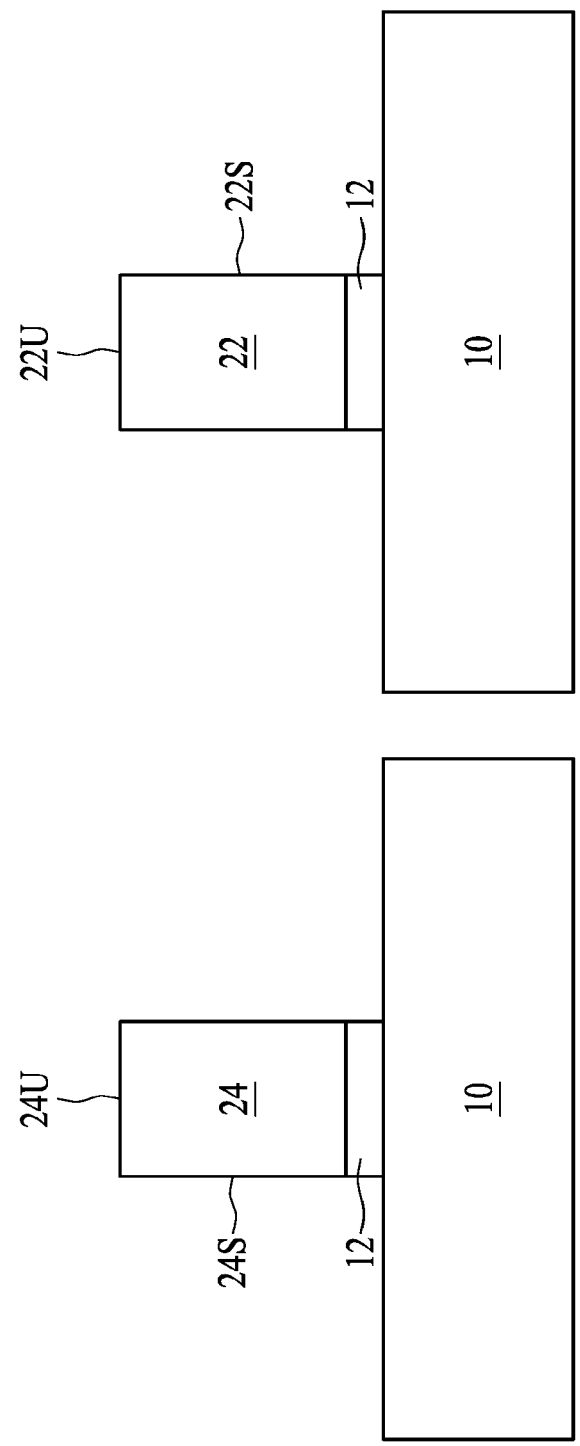
FIGS. 2A, 2B, 2C, 2D, 2E, and 2F are cross-sectional views at one of various operations of manufacturing spacer structures according to some embodiments of the present disclosure.

FIGS. 2A, 2B, 2C, 2D, 2E, and 2F are cross-sectional views at one of various operations of manufacturing spacer structures according to some embodiments of the present disclosure. As depicted in FIG. 2A and operation 110 in FIG. 1, the method 100 begins at operation 110 in which a substrate 10 is received. The substrate 10 includes a wafer over which devices such as semiconductor devices or other devices are to be formed. In some embodiments, the substrate 10 includes a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate 10 includes a multilayered substrate, such as a silicon-on-insulator (SOI) substrate, which includes a bottom semiconductor layer, a buried oxide layer (BOX) and a top semiconductor layer.

As depicted in FIG. 2A and operation 120 in FIG. 1, the method 100 continues with operation 120, in which a first conductive structure 22 and a second conductive structure 24 are formed over the substrate 10. In some embodiments, the first conductive structure 22 and the second conductive structure 24 are gate structures of transistor devices such as gate structures of MOSFET devices, or gate structures of memory cells such as gate structures of static random access memory (SRAM) cells or gate structures of multi-time programmable (MTP) cells. The first conductive structure 22 and the second conductive structure 24 may be referred to as a first gate structure and a second gate structure.

In some embodiments, the first conductive structure 22 and the second conductive structure 24 are formed of semiconductive material such as doped polycrystalline silicon. In some other embodiments, the material of the first conductive structure 22 and the second conductive structure 24 may be metal, alloy or any other suitable conductive materials. The first conductive structure 22 and the second conductive structure 24 may be single-layered structures or multi-layered structures. The first conductive structure 12 and the second conductive structure 14 may be equal or different in size such as in width, in length and/or in height. In some embodiments, gate dielectric layers 12 may be formed between the first conductive structure 22 and the substrate 10 and between the second conductive structure 24 and the substrate 10. The gate dielectric layer 12 may include dielectric material such as silicon oxide, or any other suitable dielectric materials with suitable dielectric constant. Moreover, the gate dielectric layers 12 may be patterned along with the first conductive structure 22 and the second conductive structure 24. In some embodiments, cap layers (not shown) such as protection layer and/or salicide layers are formed over an upper surface 22U of the first conductive structure 22 and an upper surface 24U of the second conductive structure 24.

Figure 2B:
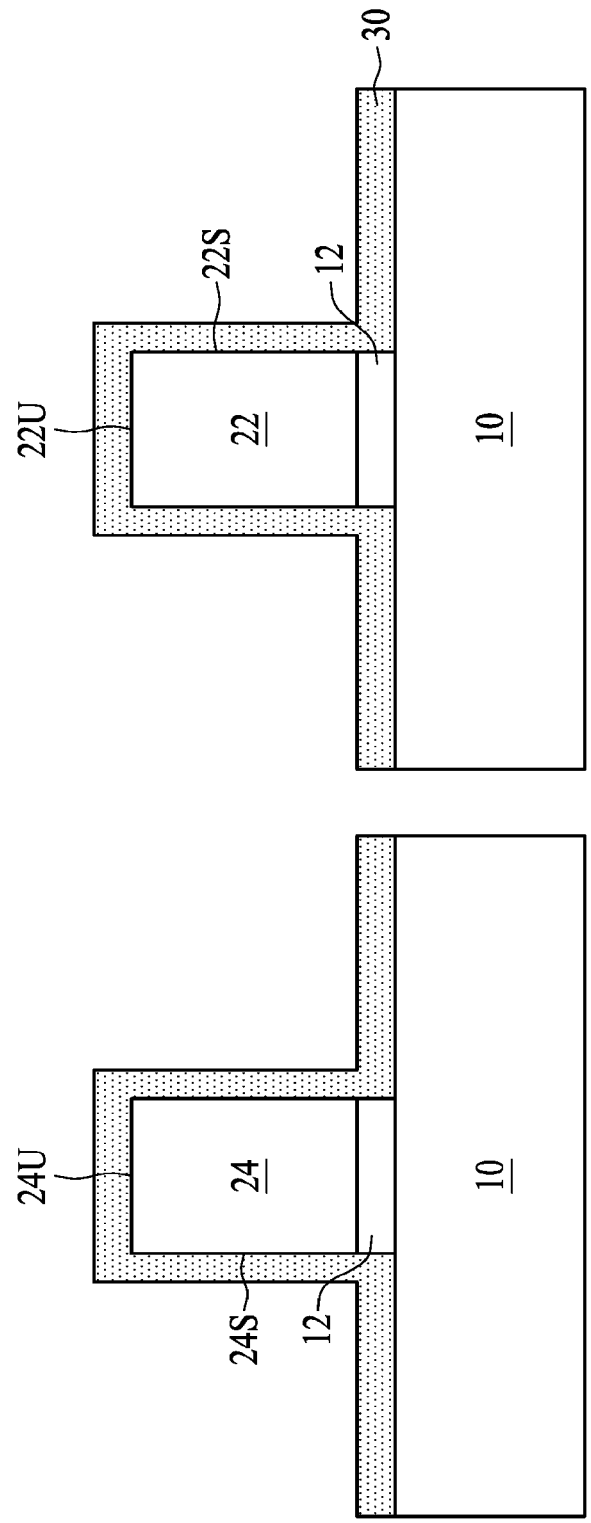

As depicted in operation 130 in FIG. 1, the method 100 continues with operation 130, in which a first patterned dielectric layer covering the first conductive structure and exposing the second conductive structure is formed. In some embodiments, the first patterned dielectric layer is formed as follows. As depicted in FIG. 2B, a dielectric layer 30 is formed, covering the upper surface 22U and sidewalls 22S of the first conductive structure 22 and the upper surface 24U and sidewalls 24S of the second conductive structure 24. In some embodiments, the dielectric layer 30 is formed by deposition such as chemical vapor deposition (CVD), but not limited thereto. In some embodiments, the dielectric layer 30 is a single-layered structure, which may be formed of a dielectric material such as silicon oxide, silicon nitride or other suitable dielectric or insulative materials. In some embodiments, the dielectric layer 30 is a multi-layered structure, which includes a plurality of dielectric films. For example, the multi-layered dielectric layer includes silicon oxide-silicon nitride (ON) dielectric layer, silicon oxide-silicon nitride-silicon oxide (ONO) dielectric layer, or any other suitable dielectric film stacks. In some embodiments, the dielectric layer 30 is a liner dielectric layer, which may be substantially conformal to the upper surface 22U and the sidewalls 22S of the first conductive structure 22 and the upper surface 24U and the sidewalls 24S of the second conductive structure 24, but not limited thereto. The thickness of the dielectric layer 30 may be modified based on the requirement for desired spacer width.

Figure 2C:
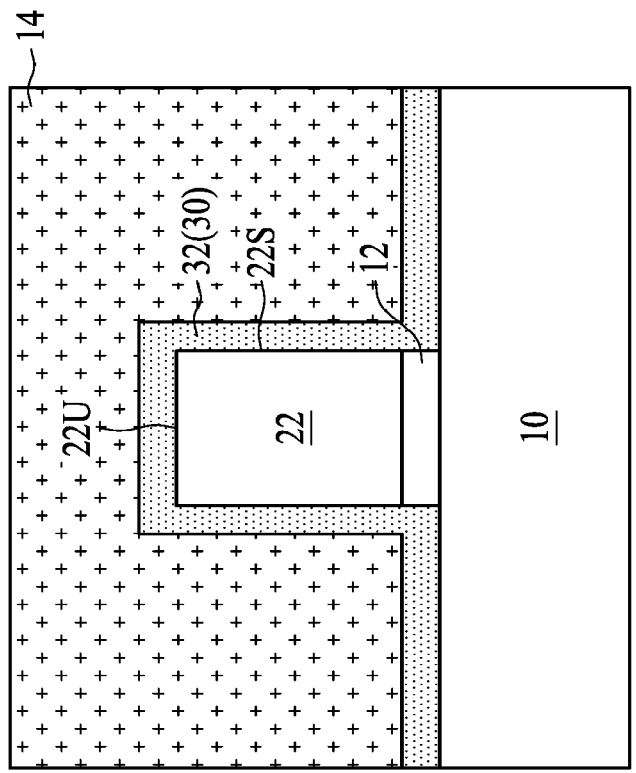
Figure 2C:
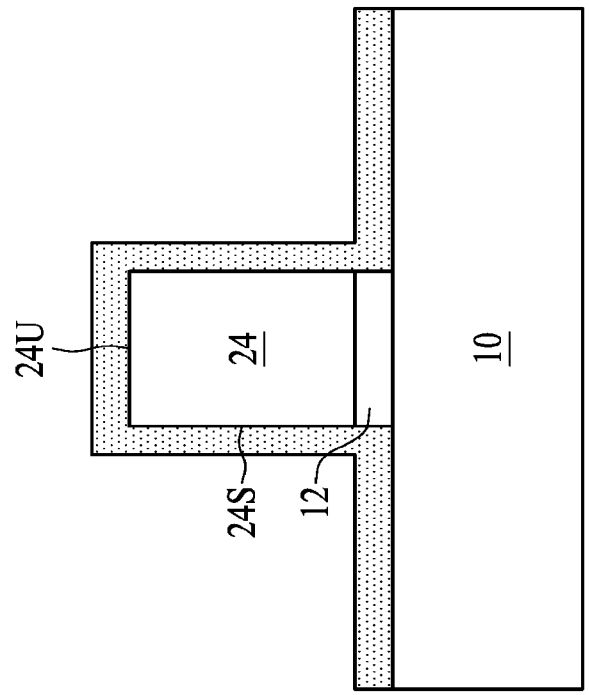

As depicted in FIG. 2C, the dielectric layer 30 disposed over the upper surface 22U and the dielectric layer 30 disposed on the sidewalls 22S of the first conductive structure 22 are blocked with a mask layer 14, e.g., a photoresist layer or a hard mask layer.

Figure 2D:
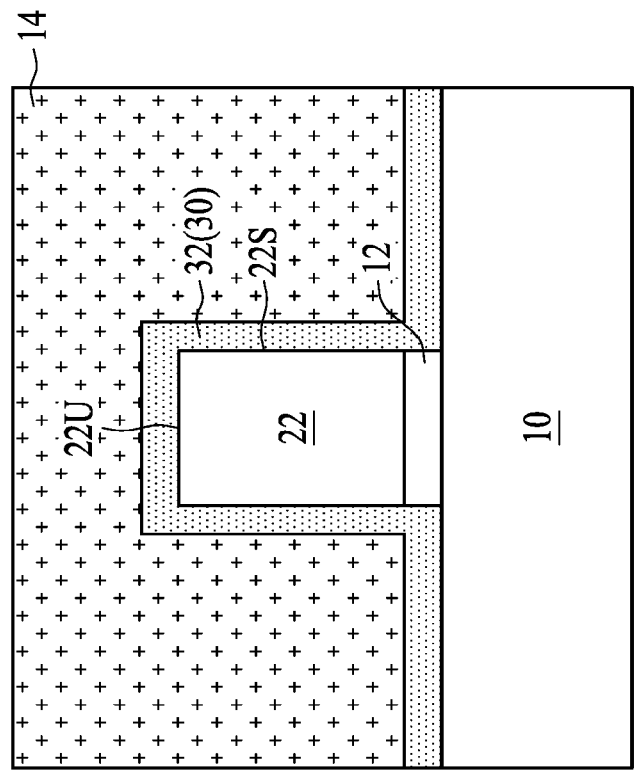
Figure 2D:
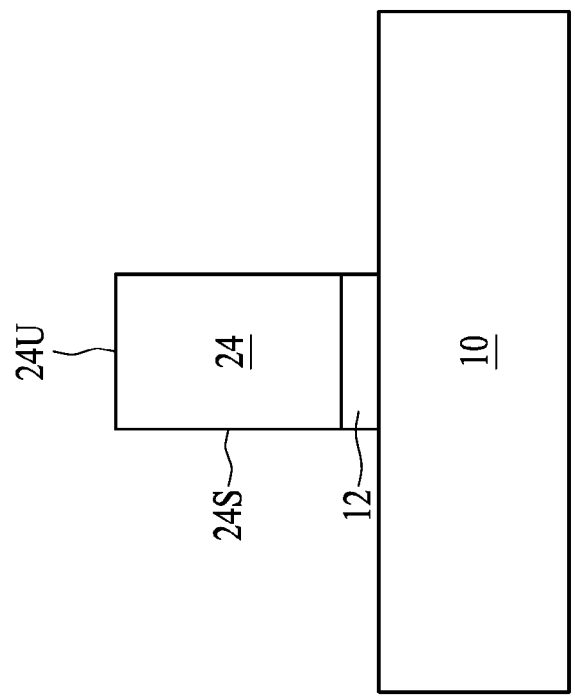

As depicted in FIG. 2D, the dielectric layer 30 exposed by the mask layer 14 is removed, resulting in a first patterned dielectric layer 32. In some embodiments, the dielectric layer 30 is removed by etching such as dry etching and/or wet etching. The mask layer 14 is then removed.

Figure 2E:
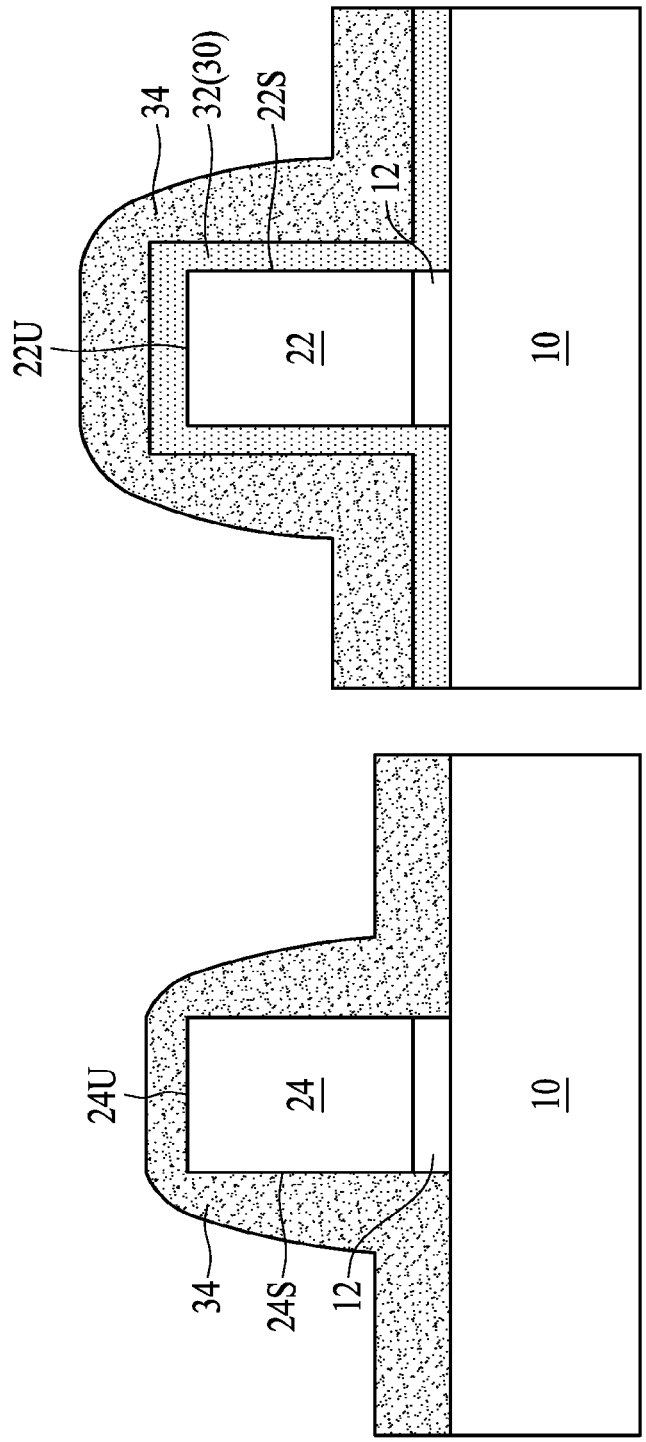

As depicted in FIG. 2E and operation 140 in FIG. 1, the method 100 continues with operation 140, in which a second dielectric layer 34 is formed, covering the first patterned dielectric layer 32 and the upper surface 24U and the sidewalls 24S of the second conductive structure 24. In some embodiments, the second dielectric layer 34 is formed by deposition such as CVD, but not limited thereto. In some embodiments, the material of the second dielectric layer 34 is different from the dielectric layer 30. By way of an example, the second dielectric layer 34 is formed of silicon nitride. In some other embodiments, the material of the second dielectric layer 34 may include silicon oxide or any other suitable dielectric materials.

Figure 2F:
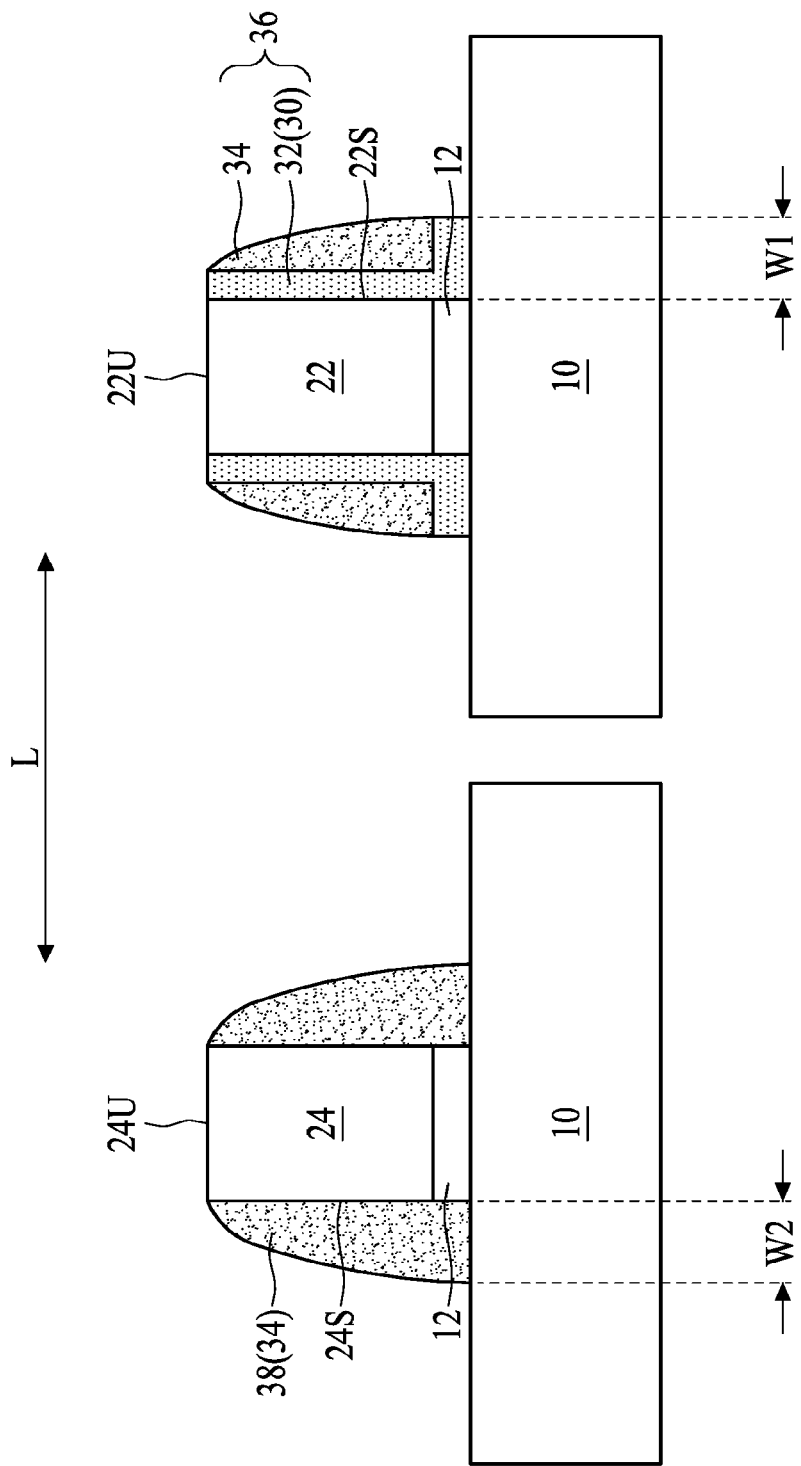

As depicted in FIG. 2F and operation 150 in FIG. 1, the method 100 continues with operation 150, in which the second dielectric layer 34 disposed over the upper surface 22U of the first conductive structure 22 and the upper surface 24U of the second conductive structure 24 is removed. Since the thickness of the second dielectric layer 34 proximal to the sidewalls 22S of the first conductive structure 22 and the sidewalls 24S of the second conductive structure 24 is larger than that of the second dielectric layer 34 proximal to the upper surface 22U of the first conductive structure 22, the upper surface 24U of the second conductive structure 24 and the surface of the substrate 10, the second dielectric layer 34 can be patterned by etching without a mask layer. In some embodiments, the second dielectric layer 34 disposed over the upper surface 22U of the first conductive structure 22 and the upper surface 24U of the second conductive structure 24 is removed by an anisotropic etching such as a dry etching. Consequently, the second dielectric layer 34 remaining on the sidewalls 22S of the first conductive structure 22 and on the sidewalls 24S of the second conductive structure 24 have a substantially arc-shaped structure (also referred to as a D-shaped structure). Subsequent to etching the second dielectric layer 34, the first patterned dielectric layer 32 exposed by the second dielectric layer 34 is removed by dry etching or wet etching, resulting in an L-shaped structure.

Accordingly, the first patterned dielectric layer 32 and the second dielectric layer 34 stacking in a lateral direction L (as indicated by a double-headed arrow) and disposed on the sidewalls 22S of the first conductive structure 22 form a first spacer structure 36. Furthermore, the second dielectric layer 34 disposed on the sidewalls 24S of the second conductive structure 24 forms a second spacer structure 38. The first spacer structure 36 is larger than the second spacer structure 38 in width. Specifically, the width W1 of the first spacer structure 36 is larger than the width W2 of the second spacer structure 24 in the lateral direction L. In some embodiments, the first spacer structures 36 disposed on two opposite sides of the first conductive structure 22 are equal in width. The second spacer structure 38 disposed on two opposite sides of the second conductive structure 24 are equal in width.

The first conductive structure 22 with a wider spacer width W1 and the second conductive structure 24 with a narrower spacer width W2 are formed in the same integrated circuit, and can be applied to different devices of different requirements, specifications and/or functionalities. For example, the first conductive structure 22 with the wider spacer width W1 and the second conductive structure 24 with the narrower spacer width W2 may be respectively configured as gate structure of high voltage MOSFET device and gate structure of low voltage MOSFET device, gate structure of SRAM or MTP cell with larger dimension and gate structure of SRAM or MTP cell with smaller dimension, or different devices of different requirements, specifications and/or functionalities. In some embodiments, the first conductive structure 22 with the wider spacer width W1 is applied to adjacent gate structures with larger spacing, while the second conductive structure 24 with the narrower spacer width W2 is applied to adjacent gate structures with smaller spacing.

The structure and manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
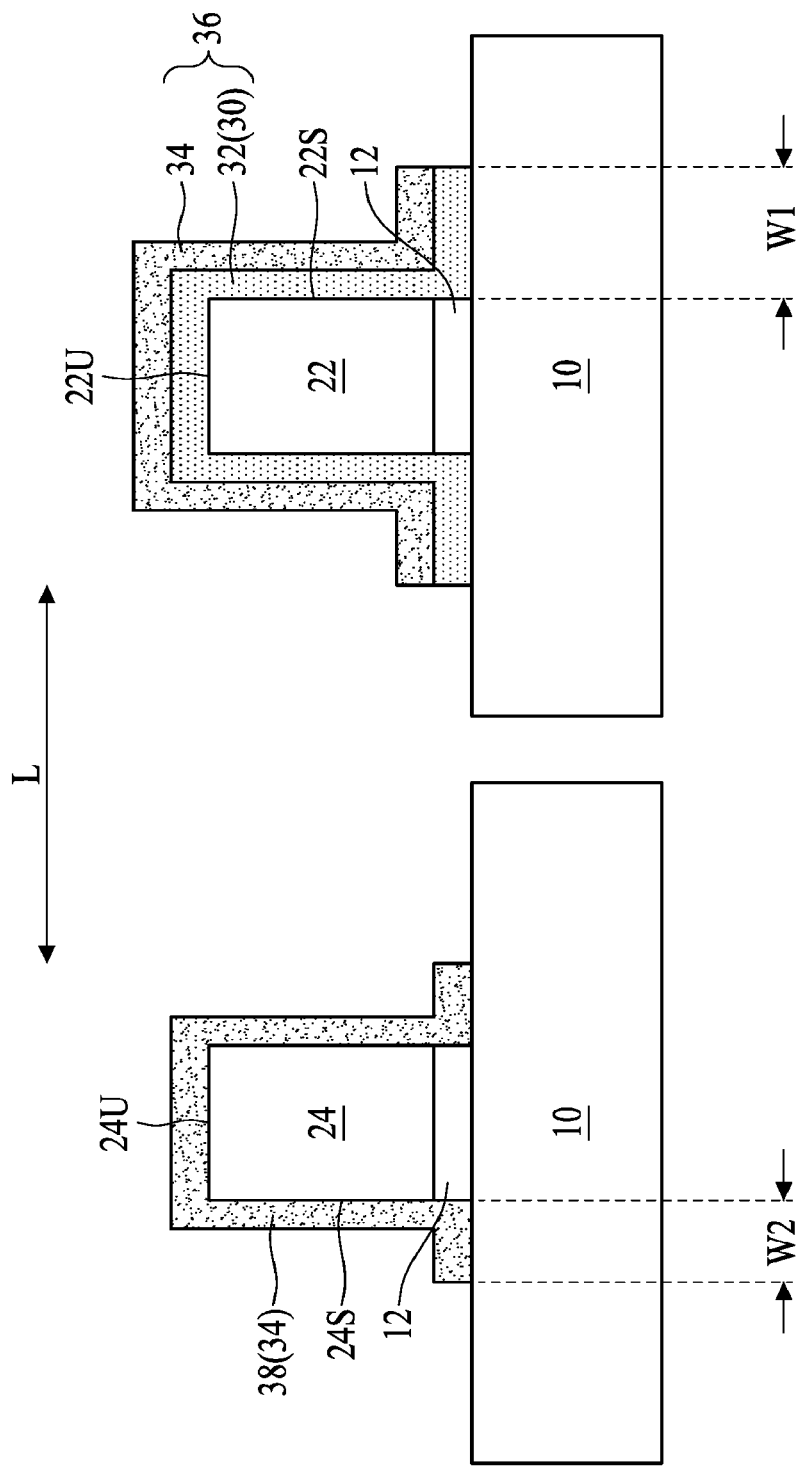
FIG. 3 is a cross-sectional view of manufacturing spacer structures according to some alternative embodiments of the present disclosure.

FIG. 3 is a cross-sectional view of manufacturing spacer structures according to some alternative embodiments of the present disclosure. In these alternative embodiments, the second dielectric layer 34 disposed over the upper surface 22U of the first conductive structure 22 and the upper surface 24U of the second conductive structure 24 is removed by an isotropic etching such as a wet etching. As such, the second dielectric layer 34 remaining on the sidewalls 22S of the first conductive structure 22 has a substantially L-shaped structure as depicted in FIG. 3.

Accordingly, the first patterned dielectric layer 32 and second dielectric layer 34 stacking in the lateral direction L and disposed on the sidewalls 22S of the first conductive structure 22 are both L-shaped structures, and form the first spacer structure 36. The second dielectric layer 34 disposed on the sidewalls 24S of the second conductive structure 24 is L-shaped structure, and forms the second spacer structure 38. Similarly, the width W1 of the first spacer structure 36 is larger than the width W2 of the second spacer structure 24.

Figure 4A:
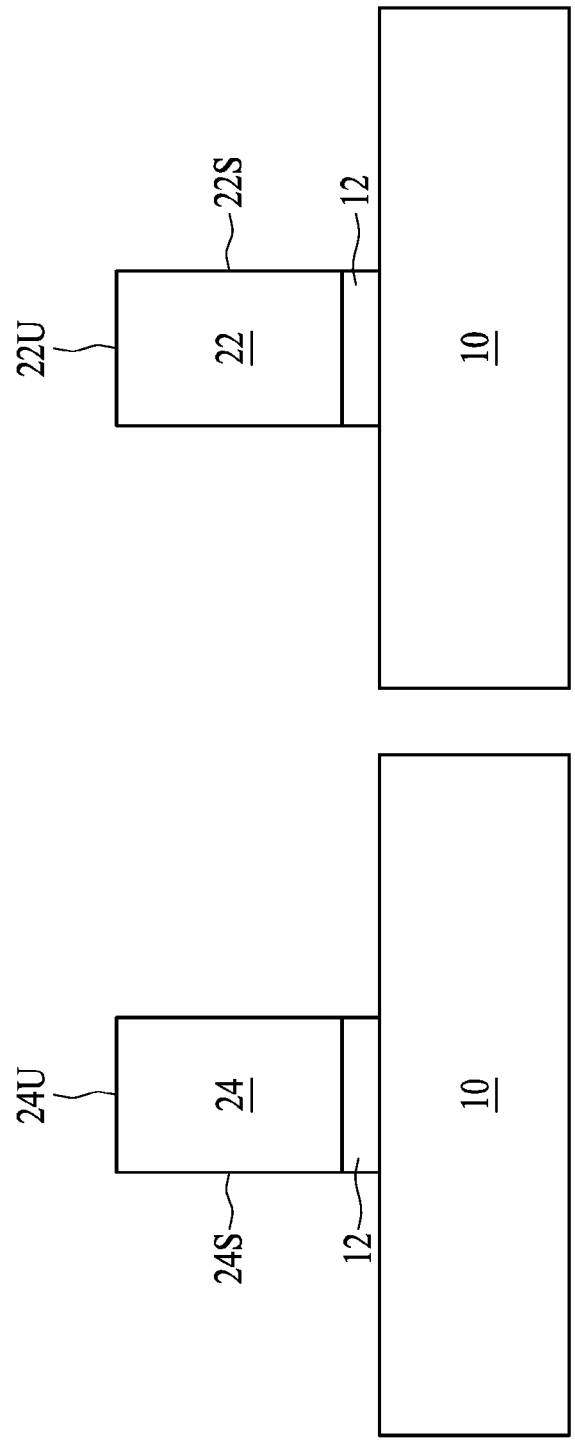
FIGS. 4A, 4B, 4C, 4D, 4E, and 4F are cross-sectional views at one of various operations of manufacturing spacer structures according to some embodiments of the present disclosure.
Figure 4B:
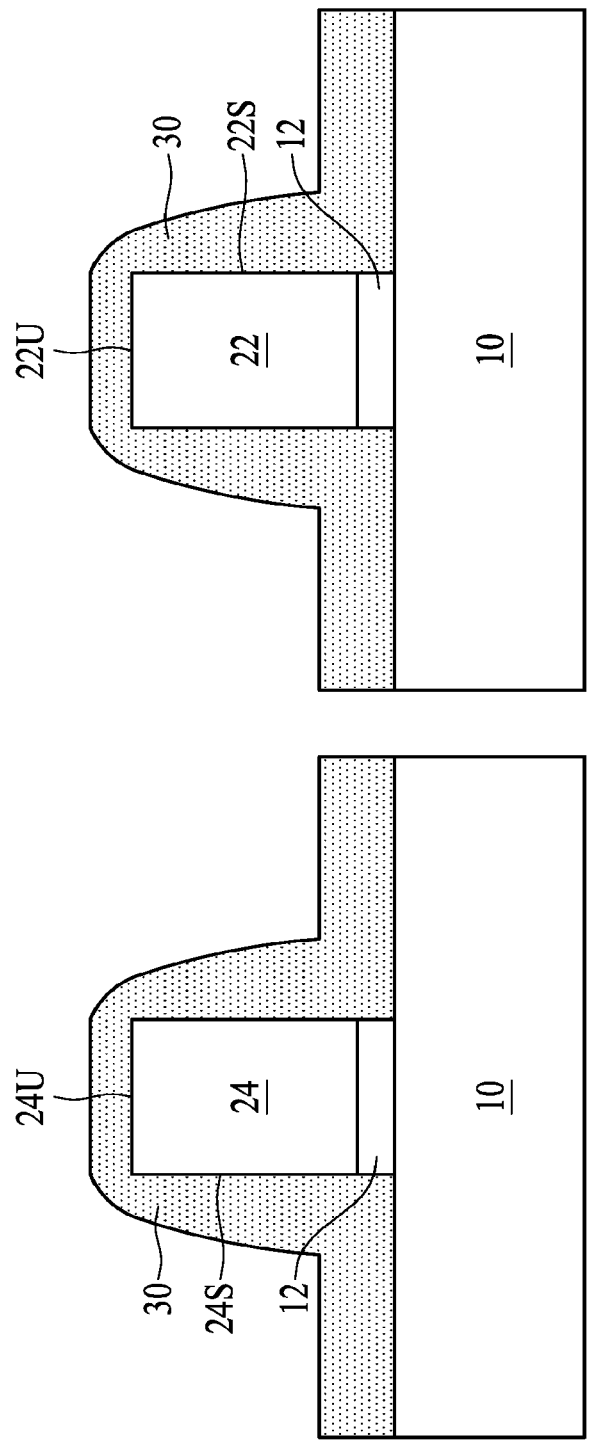

FIGS. 4A, 4B, 4C, 4D, 4E, and 4F are cross-sectional views at one of various operations of manufacturing spacer structures according to some embodiments of the present disclosure. As depicted in FIG. 4A, the first conductive structure 22 and the second conductive structure 24 are formed over the substrate 10. As depicted in FIG. 4B, a dielectric layer 30 is formed, covering the upper surface 22U and sidewalls 22S of the first conductive structure 22 and the upper surface 24U and sidewalls 24S of the second conductive structure 24.

Figure 4C:
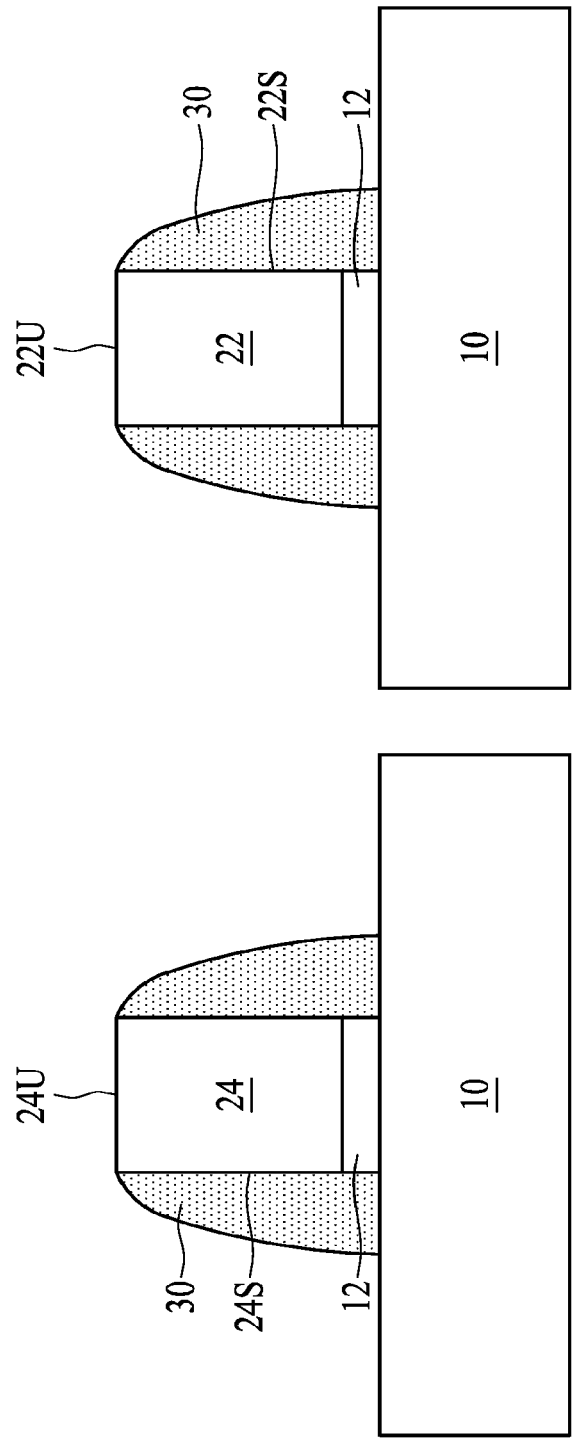

As depicted in FIG. 4C, the dielectric layer 30 disposed over the upper surface 22U of the first conductive structure 22 and the upper surface 24U of the second conductive structure 24 is removed, while at least some of the dielectric layer 30 disposed on the sidewalls 22S of the first conductive structure 22 and the sidewalls 24S of the second conductive structure 24 is preserved. In some embodiments, since the thickness of the dielectric layer 30 proximal to the sidewalls 22S of the first conductive structure 22 and the sidewalls 24S of the second conductive structure 24 is larger than that of the dielectric layer 30 proximal to the upper surface 22U of the first conductive structure 22, the upper surface 24U of the second conductive structure 24 and the surface of the substrate 10, the dielectric layer 30 can be removed by etching without a mask layer. By way of an example, the dielectric layer 30 disposed over the upper surface 22U of the first conductive structure 22 and the upper surface 24U of the second conductive structure 24 is removed by an anisotropic etching such as a dry etching, and the dielectric layer 30 remaining on the sidewalls 22S of the first conductive structure 22 and on the sidewalls 24S of the second conductive structure 24 have a substantially arc-shaped structure.

Figure 4D:
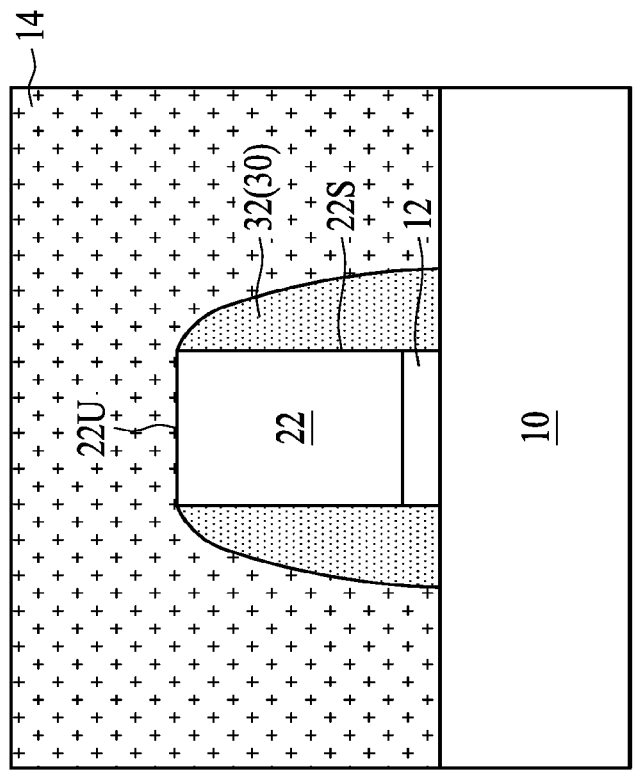
Figure 4D:
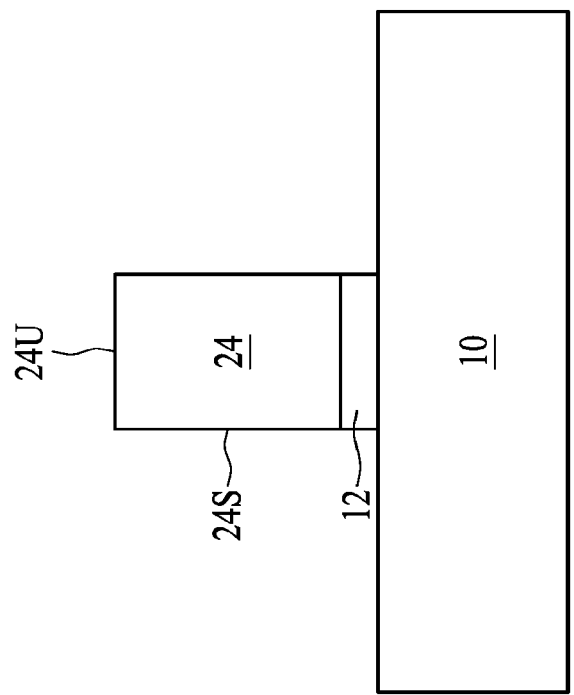

As depicted in FIG. 4D, the upper surface 22U of the first conductive structure 22 and the dielectric layer 30 disposed on the sidewalls 22S of the first conductive structure 22 is blocked with a mask layer 14 such as a photoresist layer or a hard mask layer, while the second conductive structure 24 is exposed. Subsequently, the dielectric layer 30 exposed by the mask layer 14 is removed, resulting in the first patterned dielectric layer 32, which covers the sidewalls 22S of the first conductive structure 22 and exposes the sidewalls 24S of the second conductive structure 24. Then, the mask layer 14 is removed.

Figure 4E:
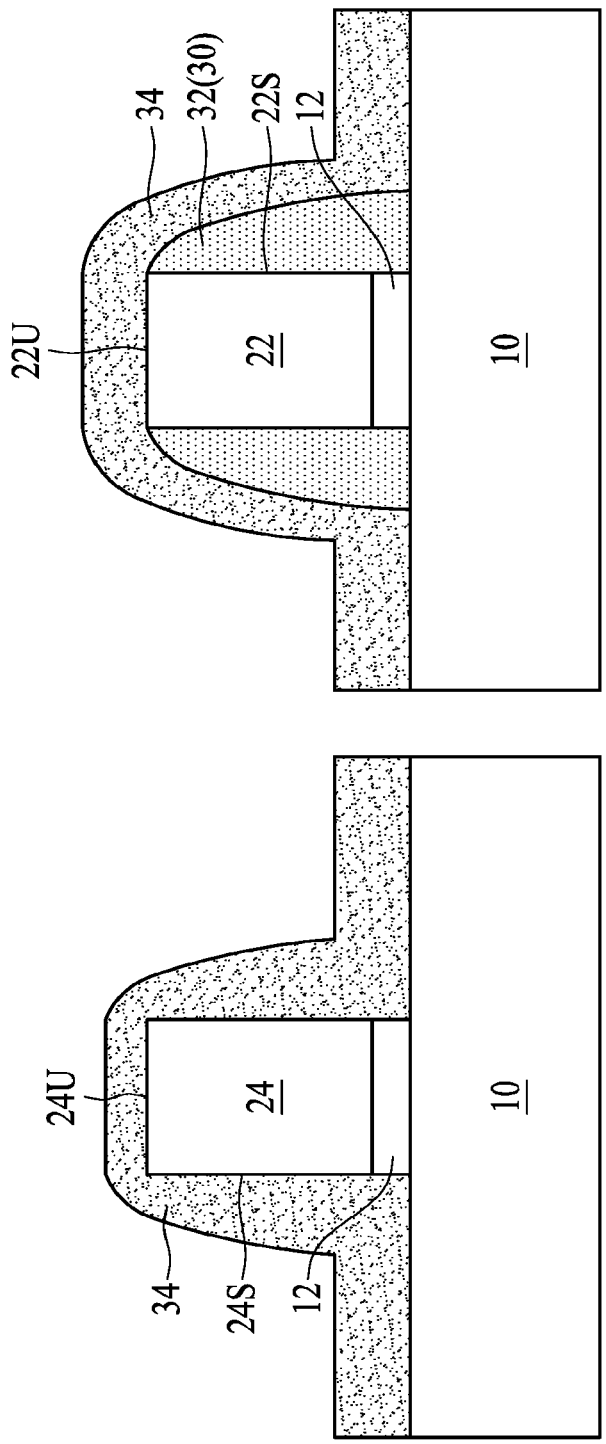

As depicted in FIG. 4E, a second dielectric layer 34 is formed, covering the first patterned dielectric layer 32 and the upper surface 24U and the sidewalls 24S of the second conductive structure 24.

Figure 4F:
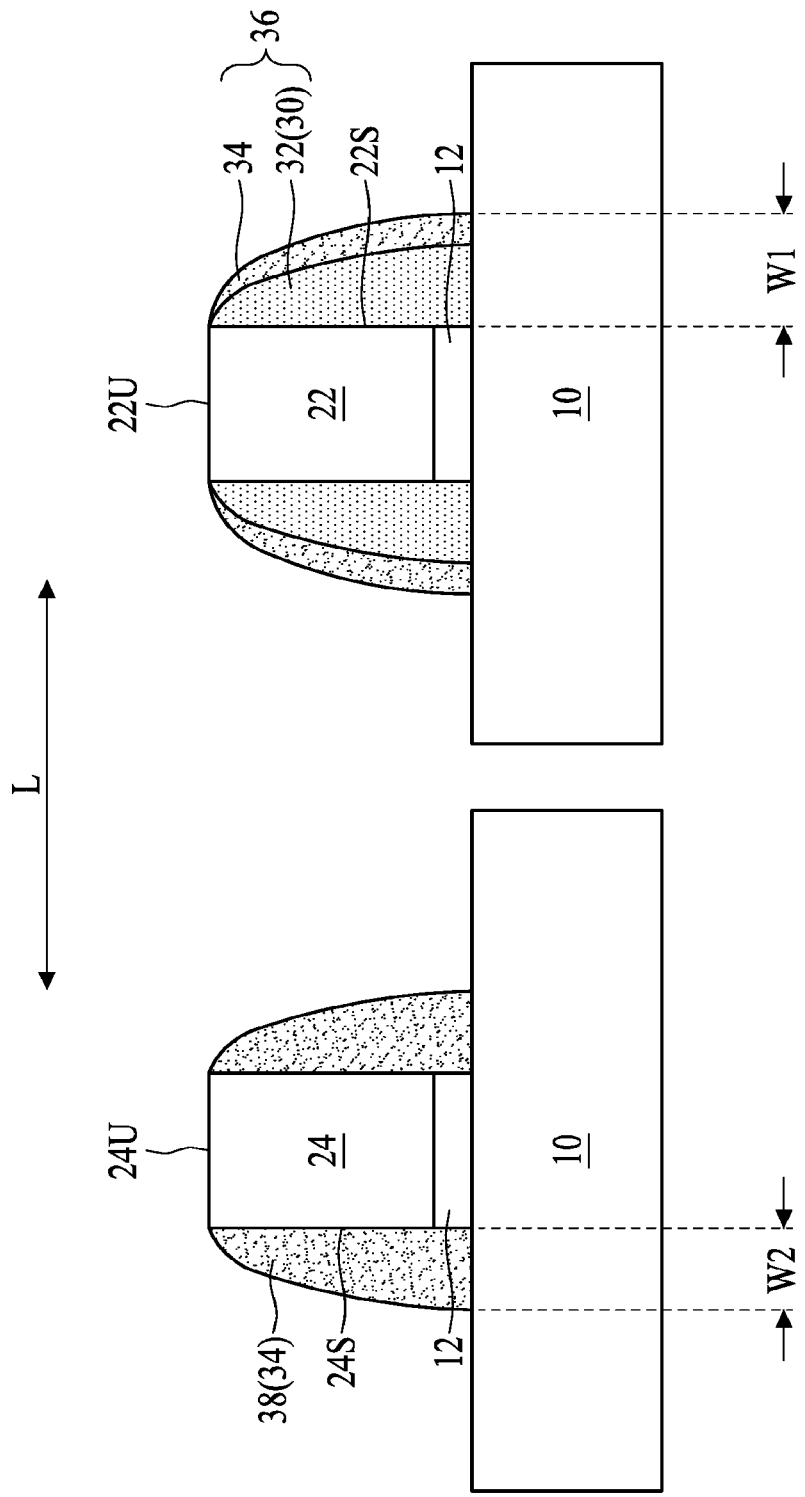

As depicted in FIG. 4F, the second dielectric layer 34 disposed over the upper surface 22U of the first conductive structure 22 and the upper surface 24U of the second conductive structure 24 is removed. Since the thickness of the second dielectric layer 34 proximal to the sidewalls 22S of the first conductive structure 22 and the sidewalls 24S of the second conductive structure 24 is larger than that of the second dielectric layer 34 proximal to the upper surface 22U of the first conductive structure 22, the upper surface 24U of the second conductive structure 24 and the surface of the substrate 10, the second dielectric layer 34 can be removed by etching without a mask layer. By way of an example, the second dielectric layer 34 disposed over the upper surface 22U of the first conductive structure 22 and the upper surface 24U of the second conductive structure 24 is removed by an anisotropic etching such as a dry etching, and the second dielectric layer 34 remaining on the sidewalls 22S of the first conductive structure 22 and on the sidewalls 24S of the second conductive structure 24 have a substantially arc-shaped structure.

Accordingly, the first patterned dielectric layer 32 and the second dielectric layer 34 stacking in the lateral direction L and disposed on the sidewalls 22S of the first conductive structure 22 form a first spacer structure 36. Moreover, the second dielectric layer 34 disposed on the sidewalls 24S of the second conductive structure 24 forms a second spacer structure 38. The width W1 of the first spacer structure 36 is larger than the width W2 of the second spacer structure 24.

Figure 5A:
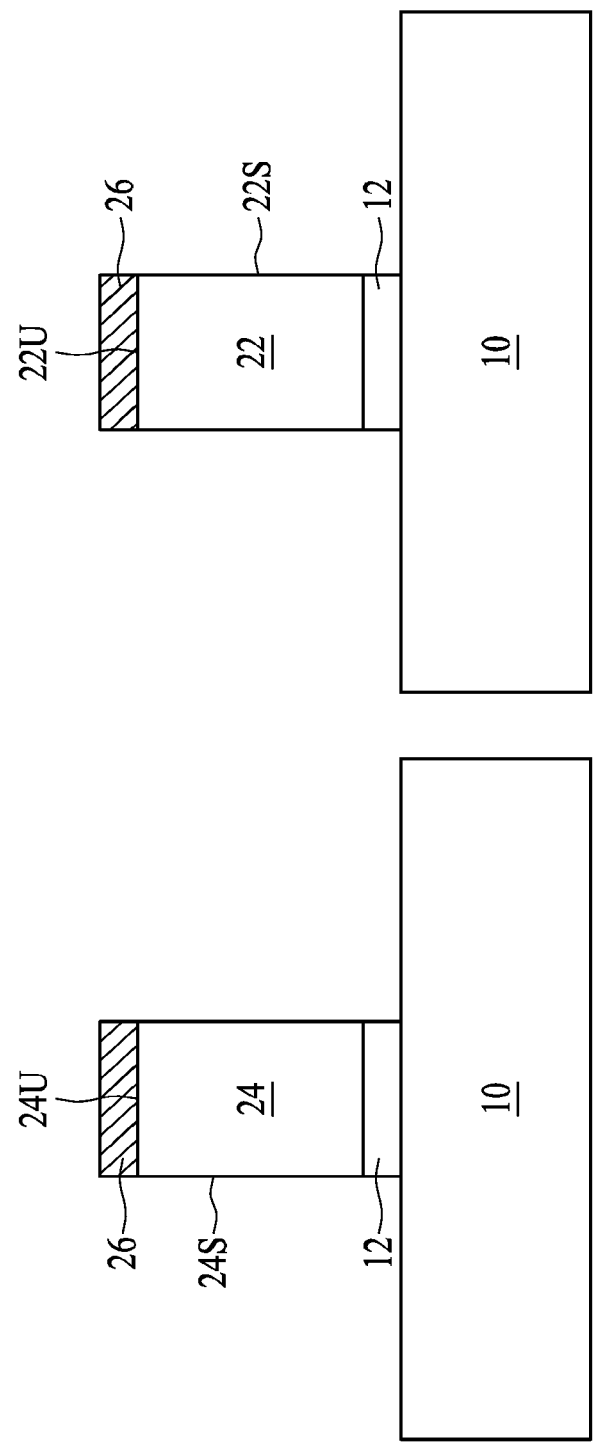
FIGS. 5A, 5B, 5C, 5D, and 5E are cross-sectional views at one of various operations of manufacturing spacer structures according to some embodiments of the present disclosure.

FIGS. 5A, 5B, 5C, 5D, and 5E are cross-sectional views at one of various operations of manufacturing spacer structures according to some embodiments of the present disclosure. As depicted in FIG. 5A, the first conductive structure 22 and the second conductive structure 24 are formed over the substrate 10. In some embodiments, cap layers 26 such as protection layers and/or salicide layers are formed over the upper surface 22U of the first conductive structure 22 and the upper surface 24U of the second conductive structure 24.

Figure 5B:
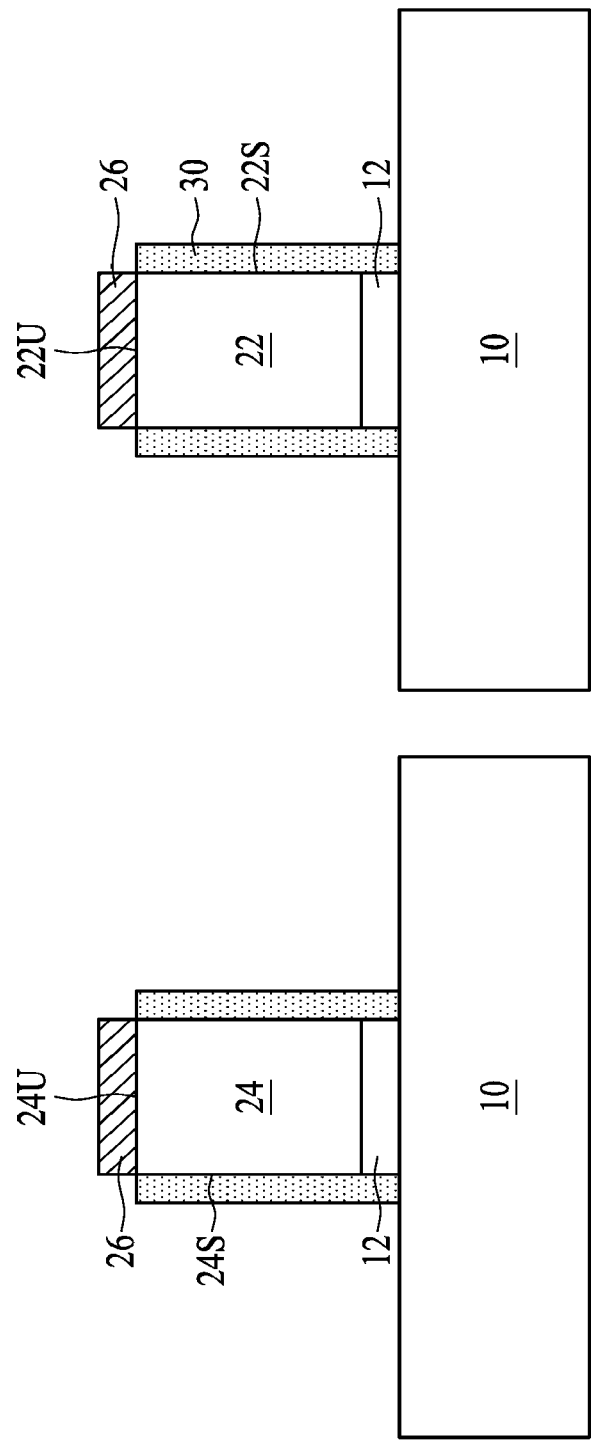

As depicted in FIG. 5B, a dielectric layer 30 is locally formed, covering the sidewalls 22S of the first conductive structure 22 and the sidewalls 24S of the second conductive structure 24. In some embodiments, the first conductive structure 22 and the second conductive structure 24 are formed of polycrystalline silicon, and thus the dielectric layer 30 can be locally formed, covering the sidewalls 22S of the first conductive structure 22 and the sidewalls 24S of the second conductive structure 24 by oxidization.

Figure 5C:
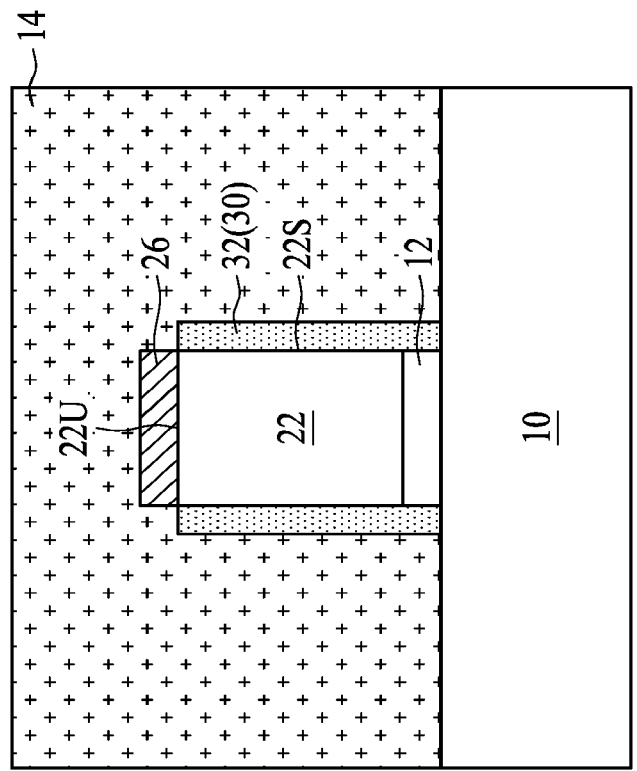

As depicted in FIG. 5C, the cap layer 26 disposed over the upper surface 22U of the first conductive structure 22 and the dielectric layer 30 disposed on the sidewalls 22S of the first conductive structure 22 is blocked with a mask layer 14. Then, the dielectric layer 30 exposed by the mask layer 14 is removed, resulting in the first patterned dielectric layer 32. The dielectric layer 30 exposed by the mask layer 14 may be etched by anisotropic etching or isotropic etching. In some embodiments, the patterned dielectric layer 30 disposed on the sidewalls 22S of the first conductive structure 22 has a substantially I-shaped structure. Subsequently, the mask layer 14 is removed.

Figure 5D:
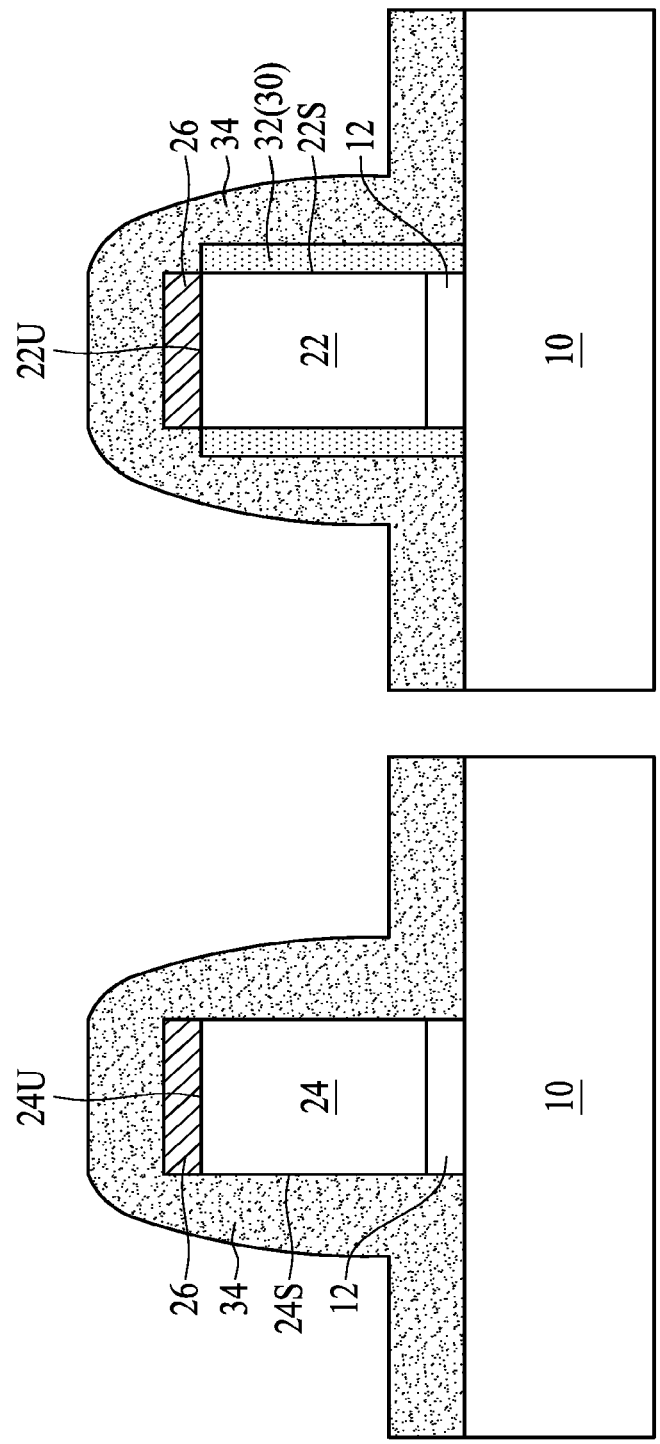

As depicted in FIG. 5D, a second dielectric layer 34 is formed, covering the first patterned dielectric layer 32, the first conductive structure 22 and the second conductive structure 24.

Figure 5E:
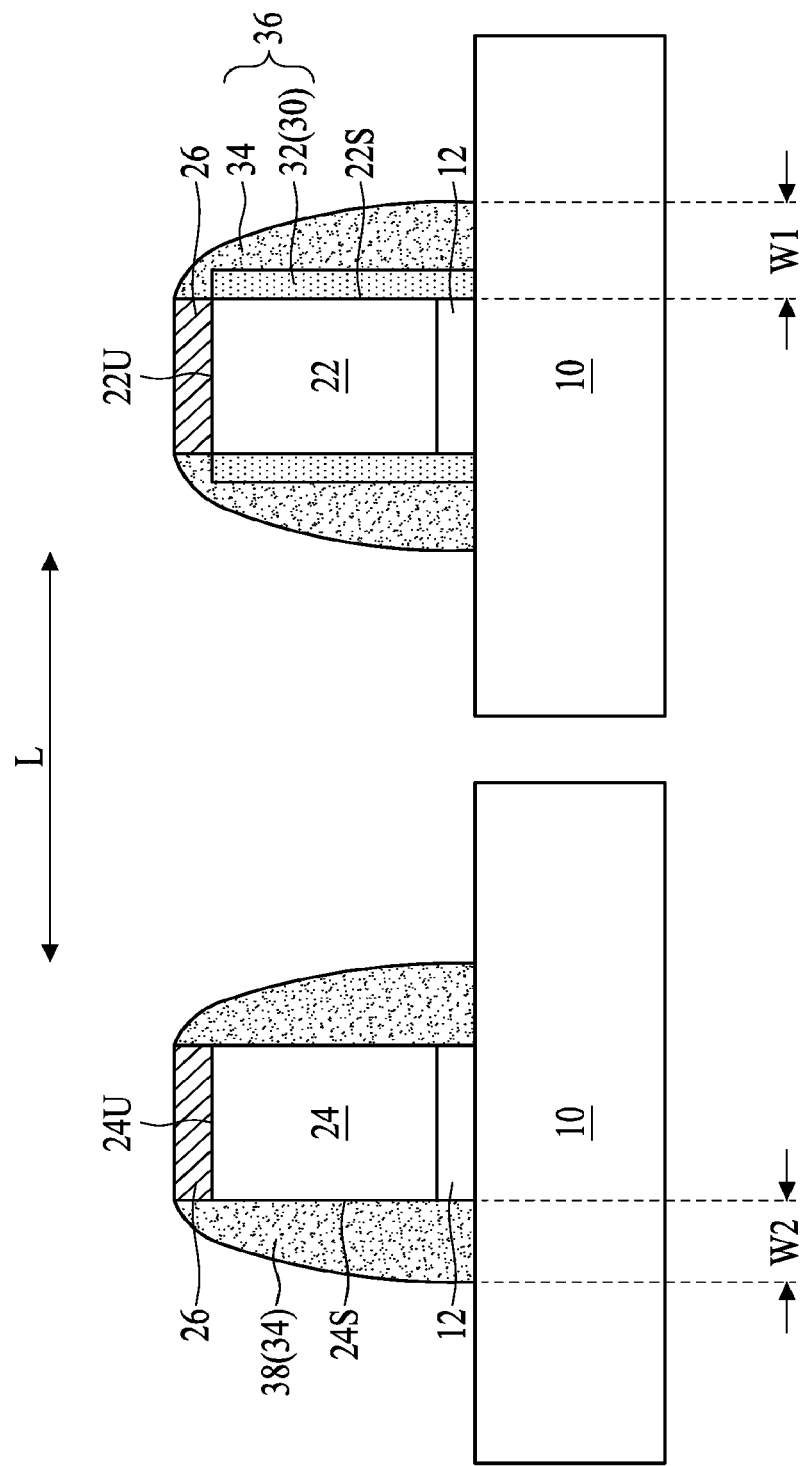

As depicted in FIG. 5E, the second dielectric layer 34 disposed over the upper surface 22U of the first conductive structure 22 and the upper surface 24U of the second conductive structure 24 is removed. Since the thickness of the second dielectric layer 34 proximal to the sidewalls 22S of the first conductive structure 22 and the sidewalls 24S of the second conductive structure 24 is larger than that of the second dielectric layer 34 proximal to the upper surface 22U of the first conductive structure 22, the upper surface 24U of the second conductive structure 24 and the surface of the substrate 10, the second dielectric layer 34 can be removed by etching without a mask layer. By way of an example, the second dielectric layer 34 disposed over the upper surface 22U of the first conductive structure 22 and the upper surface 24U of the second conductive structure 24 is removed by an anisotropic etching such as a dry etching. Consequently, the second dielectric layer 34 remaining on the sidewalls 22S of the first conductive structure 22 and on the sidewalls 24S of the second conductive structure 24 have a substantially arc-shaped structure.

Accordingly, the first patterned dielectric layer 32 and the second dielectric layer 34 stacking in the lateral direction L and disposed on the sidewalls 22S of the first conductive structure 22 form a first spacer structure 36. Moreover, the second dielectric layer 34 disposed on the sidewalls 24S of the second conductive structure 24 forms a second spacer structure 38. The width W1 of the first spacer structure 36 is larger than the width W2 of the second spacer structure 24.

In the present disclosure, spacer structures with two different spacer widths can be fabricated with one patterning operation. Similarly, spacer structures with three or more spacer widths can be fabricated with two or more patterning operations. For example, the spacer structures of the present disclosure may include a first spacer structure formed from one dielectric layer with a first width, a second spacer structure formed from two dielectric layers with a second width, and a third spacer structure formed from three dielectric layers with a third width. The spacer structures with three different spacer widths can be fabricated with two patterning operations, and thus manufacturing cost is reduced.

In the present disclosure, the first spacer structure comprises more dielectric layers stacking in a lateral direction than the second spacer structure. In some embodiments, the first spacer structure comprises a first dielectric layer and a second dielectric layer stacking in the lateral direction, and the second spacer structure comprises the second dielectric layer. That is, some dielectric layer(s) is shared by both the first spacer structure and the second spacer structure, while some dielectric layer(s) is not common to the first spacer structure and the second spacer structure. The spacer structure of the present disclosure is self-aligned, less complex and compatible with standard integrated circuit fabrication. The spacer structures with different spacer widths are configured as the sidewall spacers of different semiconductor devices with different applied voltages such as low voltage MOSFET device and high voltage MOSFET device. Alternatively, the spacer structures with different spacer widths may also applied to different devices such as a PMOS device and an NMOS device of a CMOS device, devices requiring multiple VDD application, memory devices of different dimensions, or other devices with different specification and/or functionalities.

The spacer structures with different spacer widths are able to respectively optimize issue or characteristic of different devices. For example, the hot carrier issue and the leakage current such as gate induced drain leakage (GIDL) in different devices can be individually modified. The spacer structures with different spacer widths make it easier to integrate different devices into one chip without performance compromise, and thus can reduce manufacturing cost.

In one exemplary aspect, a method for manufacturing spacer structures is provided. The method includes the following operations. A substrate is received. A first conductive structure and a second conductive structure are formed over the substrate. A first patterned dielectric layer is formed to cover the first conductive structure and exposing the second conductive structure. A second dielectric layer is formed to cover the first patterned dielectric layer and an upper surface and sidewalls of the second conductive structure. The second dielectric layer disposed over an upper surface of the first conductive structure and the upper surface of the second conductive structure is removed. The first patterned dielectric layer and the second dielectric layer disposed on sidewalls of the first conductive structure form a first spacer structure, and the second dielectric layer disposed on the sidewalls of the second conductive structure forms a second spacer structure. The first spacer structure is larger than the second spacer structure in width.

In another exemplary aspect, a method for manufacturing spacer structures is provided. The method includes the following operations. A substrate is provided. A first gate structure and a second gate structure are disposed over the substrate. A first dielectric layer is formed to cover the first gate structure and the second gate structure. A mask layer is formed to block the first dielectric layer over the first gate structure and to expose the first dielectric layer over the second gate structure. The first dielectric layer exposed by the mask layer is etched to expose the second gate structure. The mask layer is removed. A second dielectric layer is formed to cover the first dielectric layer over the first gate structure and the second gate structure. The second dielectric layer over an upper surface of the first gate structure and an upper surface of the second gate structure is etched without mask layer.

In yet another aspect, a spacer structure is provided. The spacer structure includes a substrate, a first conductive structure, a first spacer structure, a second conductive structure and a second spacer structure. The first conductive structure is disposed over the substrate. The first spacer structure is disposed on sidewalls of the first conductive structure. The second conductive structure is disposed over the substrate. The second spacer structure is disposed on sidewalls of the second conductive structure. The first spacer structure comprises more dielectric layers stacking in a lateral direction than the second spacer structure, and the first spacer structure is larger than the second spacer structure in width.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first conductive structure over the substrate;
   a first spacer structure disposed on sidewalls of the first conductive structure, wherein the first spacer structure comprises a first dielectric layer and a second dielectric layer over the first dielectric layer;
   a second conductive structure over the substrate; and
   a second spacer structure having the second dielectric layer disposed directly on sidewalls of the second conductive structure, wherein the first spacer structure comprises more dielectric layers stacking in a lateral direction than the second spacer structure, wherein the first spacer structure is larger than the second spacer structure in width, and wherein the second dielectric layer of the first spacer structure and the second spacer structure each has an L-shape.

2. The semiconductor structure of claim 1, wherein the first dielectric layer directly interfaces the second dielectric layer stacking in the lateral direction.

3. The semiconductor structure of claim 1, wherein the first dielectric layer and the second dielectric layer are formed of different dielectric materials.

4. The semiconductor structure of claim 1, wherein the first conductive structure and the second conductive structure comprise gate structures.

5. The semiconductor structure of claim 1, wherein the first conductive structure and the second conductive structure are formed of polycrystalline silicon.

6. The semiconductor of claim 1, wherein the first conductive structure is associated with one of a low voltage transistor or a high voltage transistor and the second conductive structure is associated with the other one of the low voltage transistor and the high voltage transistor.

7. The semiconductor structure of claim 1, wherein the first conductive structure is associated with one of an NMOS transistor or a PMOS transistor and the second conductive structure is associated with the other one of the NMOS transistor and the PMOS transistor.

8. The semiconductor structure of claim 1, wherein the first dielectric layer is an L-shape.

9. The semiconductor structure of claim 8, wherein a termination of the L-shape of the first dielectric layer and a termination of the L-shape of the second dielectric layer of the second spacer structure are aligned.

10. A semiconductor structure comprising:
    a substrate having a first gate structure and a second gate structure;
    a first spacer structure disposed on sidewalls of the first gate structure, wherein the first spacer structure includes a first dielectric layer comprising a first composition having an L-shape;
    a second spacer structure disposed on sidewalls of the second gate structure, wherein the second spacer structure includes:
      the first dielectric layer having the first composition having an L-shape; and
      a second dielectric layer having an L-shape and interposing the first dielectric layer and the second gate structure, the second dielectric layer having a second composition, the second dielectric layer conformal to the sidewalls of the second gate structure and to substrate regions adjacent to the second gate structure, and the first dielectric layer conformal to the second dielectric layer; and
    wherein the first spacer structure has a first width measured in a lateral direction, the second spacer structure has a second width measured in the lateral direction, the first width being less than the second width.

11. The semiconductor structure of claim 10, wherein the first dielectric layer directly interfaces the sidewalls of the first gate structure.

12. The semiconductor structure of claim 11, wherein the second dielectric layer directly interfaces the sidewalls of the second gate structure.

13. The semiconductor structure of claim 10, wherein in the first spacer structure the first dielectric layer extends to a top surface of the first gate structure, and wherein in the second spacer structure the first dielectric layer extends to a top surface of the second gate structure.

14. The semiconductor structure of claim 10, wherein the second spacer structure includes an outer sidewall defining the second width, wherein the outer sidewall includes a first portion defined by the first dielectric layer and a second portion defined by the second dielectric layer.

15. The semiconductor structure of claim 10, wherein the first dielectric layer and the second dielectric layer are both L-shaped in the second spacer structure.

16. The semiconductor structure of claim 10, wherein the second dielectric layer is an L-shape.

17. A semiconductor structure comprising:
- a substrate having a first gate structure and a second gate structure;
- a first spacer structure disposed on sidewalls of the first gate structure, wherein the first spacer structure includes a first dielectric layer comprising a first composition that abuts the first gate structure and extends to an outer sidewall of the first spacer structure;
- a second spacer structure disposed on sidewalls of the second gate structure, wherein the second spacer structure includes:
  - a second dielectric layer abutting the second gate structure and extending to a first sidewall;
  - the first dielectric layer abutting the first sidewall of the second dielectric layer and extending to an outer sidewall of the second spacer structure; and wherein the first spacer structure has a first width measured in a lateral direction from the first gate structure to the outer sidewall of the first spacer structure, the second spacer structure has a second width measured in the lateral direction, the second width measured from the second gate structure to the outer sidewall of the second spacer structure;

wherein the first width is less than the second width; and wherein the first dielectric layer has an L-shape in the first spacer structure and an L-shape in the second spacer structure.

18. The semiconductor structure of claim 17, wherein the first gate structure and the second gate structure are associated with different transistor types.

19. The semiconductor structure of claim 17, wherein the second dielectric layer has the L-shape in the second spacer structure.

20. The semiconductor structure of claim 17, wherein the first dielectric layer and the second dielectric layer comprise different dielectric materials.

* * * * *